United States Patent [19]
Doyle et al.

[11] Patent Number: 5,347,197
[45] Date of Patent: Sep. 13, 1994

[54] DISPLAY DEVICE HAVING A DISPLAY TUBE INCLUDING A COLD CATHODE AND A CURRENT MIRROR DRIVE CIRCUIT FOR THE COLD CATHODE

[75] Inventors: Terence Doyle; Matheus J. G. Lammers, both of Eindhoven, Netherlands

[73] Assignee: U.S. Philips Corporation, New York, N.Y.

[21] Appl. No.: 35,131

[22] Filed: Mar. 19, 1993

[30] Foreign Application Priority Data

Mar. 23, 1992 [EP] European Pat. Off. ........ 92200831.3

[51] Int. Cl.$^5$ .................................................. H05B 39/00
[52] U.S. Cl. ........................................ 315/94; 315/97; 315/105; 315/383
[58] Field of Search ............... 315/94, 97, 105, 383, 315/246; 358/168, 74, 242, 243

[56] References Cited

U.S. PATENT DOCUMENTS

| | | | |
|---|---|---|---|
| 4,484,228 | 11/1984 | Parker | 358/243 |
| 4,484,229 | 11/1984 | Parker | 358/243 |
| 4,829,492 | 7/1986 | Choi et al. | 367/110 |
| 4,973,890 | 5/1990 | Desjardins | 315/383 |

*Primary Examiner*—Robert J. Pascal
*Assistant Examiner*—Reginald A. Ratliff
*Attorney, Agent, or Firm*—Edward W. Goodman

[57] ABSTRACT

A display device having a display tube including a cold cathode, for example a PN emitter (PNE), has the terminals of the PN emitter (PNE) coupled between first terminals of a first (CR1) and a second (CR2) current mirror. The first current repeater (CR1) is connected to an output of an amplifier (AMP) whose feedback input (FI) is connected to second terminals of the first (CR1) and second (CR2) current mirrors.

3 Claims, 1 Drawing Sheet

DISPLAY DEVICE HAVING A DISPLAY TUBE INCLUDING A COLD CATHODE AND A CURRENT MIRROR DRIVE CIRCUIT FOR THE COLD CATHODE

BACKGROUND OF THE INVENTION

1. Field of the Invention

The present invention relates to a display device having a display tube including a cold cathode, more specifically a PN emitter.

2. Description of the Related Art

Display tubes having PN emitters are known in the art. A PN emitter, which is one example of a "cold cathode", is essentially a particular kind of semiconductor diode driven in avalanche breakdown, where the escaped "hot" electrons generate the emission current. Using such a device reduces the drive voltage to typically between 5 and 10 volts, while "hot cathodes" need 120 to 150 volts. This advantage of PN emitters makes it possible to consider developing a low voltage driver (IC) for the PN emitter. However, if display tubes having PN emitters are driven in the same way as display tubes having "hot cathodes", several problems occur. The voltage-current characteristic or drive characteristic of PN emitters is extremely steep and rather different compared to present day tube characteristics. A present day drive circuit would therefore be impractical due to the extremely high gain in the voltage-current characteristic. A further problem is formed by the diode efficiency of a PN emitter, i.e., the emission current of the PN emitter divided by the current passing through the diode. Typical values of the diode efficiency range between 1% and 5%. The efficiency varies not only as a function of time but also from device to device. This must be allowed for in some way.

SUMMARY OF THE INVENTION

It is, inter alia, an object of the invention to provide a display device having a suitable drive circuit for a display tube having a cold cathode. For this purpose, one aspect of the invention provides a display device having a display tube including a cold cathode, said display device comprising amplifying means having a signal input and a feedback input, first current mirror means coupled to said amplifying means and having a first terminal and a second terminal, second current mirror means having an input and an output, said cold cathode having a first end coupled to said first terminal of said first current mirror means, and a second end coupled to said input of said second current mirror means, and feedback means having a first end coupled to said second terminal of said first current mirror means and to said output of said second current mirror means, and a second end coupled to said feedback input of said amplifying means.

In brief, the invention provides a display device having a display tube including a cold cathode whose terminals are coupled between first terminals of a first and a second current mirror, also called current mirrors. The first current mirror is coupled to an output of an amplifier whose feedback input is coupled to second terminals of the first and second current mirrors. By these current mirrors, the difference in diode current between the two terminals of the cold cathode, which is, in fact, the emission current of the cold cathode, can be fed back to the driving amplifier. This construction assures that the emission current is driven, while no separate DC adjustment is required and the efficiency is automatically corrected for. An IC comprising the amplifier and the current mirrors can be realized in a low-voltage IC process. For DC corrections, the gain of the amplifier (contrast control) can be adjusted. Frequency compensation can be achieved by using an additional peaking circuit. Gamma correction may be done separately, too.

An advantageous embodiment of the display device as set out above, is characterized in that the amplifying means has a voltage output coupled to a main terminal of the first current mirror means, while the first terminal of the first current mirror means is an input terminal, and the second terminal of the first current mirror means is an output terminal. In this embodiment, at both ends of the cold cathode the connection is low-impedance and thus less sensitive to parasitic impedances at the collector of the first current repeater transistor that is connected to the first end of the cold cathode. An alternative embodiment of the display device as set out above, is characterized in that the amplifying means has a current output coupled to an input of the first current mirror means, the first and second terminals of the first current mirror means being output terminals.

These and other aspects of the invention will be apparent from and elucidated with reference to the embodiments described hereinafter.

DESCRIPTION OF THE PREFERRED EMBODIMENT

Figure 1:
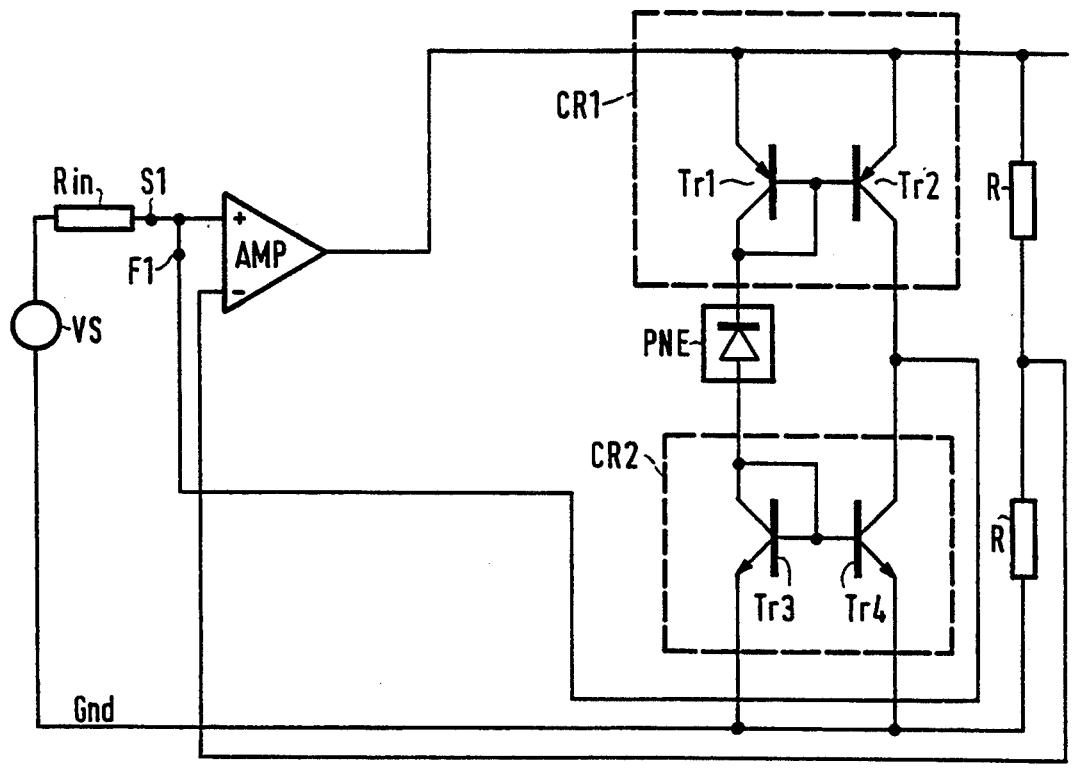
FIG. 1 shows a first embodiment of a PN emitter driver in accordance with the present invention.

In FIG. 1, a video source VS has a first terminal connected to ground Gnd, and a second terminal connected to a signal input SI of a low-voltage differential amplifier AMP through an input resistor Rin. An output of the amplifier AMP is connected to emitter terminals of PNP transistors Tr1 and Tr2 forming a first current mirror CR1. Of course, comparable field effect transistors may be used as well. The base and collector of transistor Tr1 are connected to the cathode of a PN emitter PNE, whose anode is connected to the collector and base of a NPN transistor Tr3. Transistor Tr3 is the input transistor of a second current mirror CR2 whose output transistor is formed by NPN transistor Tr4. The emitters of transistors Tr3 and Tr4 are connected to ground Gnd. The collectors of transistors Tr2 and Tr4 are interconnected and connected to a feedback input FI of the amplifier AMP. Both the signal input SI and the feedback input FI are connected to a non-inverting input of the differential amplifier AMP. The inverting input of the differential amplifier AMP is connected to the middle connection of a resistive divider which consists of the series connection of two resistors R between the output of the amplifier AMP and ground Gnd.

The circuit works as follows. The overall gain is determined by the input resistor Rin. For example, assuming a peak beam current of 4 mA is required, then Rin is 175 Ohm. The output voltage Vdrive of the amplifier AMP effectively determines the voltage across the PN emitter PNE, because the anode is a virtual ground at about 0.7 V, while the voltage drop across Tr1 is also about 0.7 V. The currents flowing at both ends of the PN emitter PNE, viz. through the transistors Tr1 and Tr3, are mirrored at the collectors of Tr2 and Tr4, respectively. The differential current is, in fact, the emission current. For an increasing voltage over the PN emitter PNE, which results from an increasing video signal, the differential current, flowing in Tr4, also increases—thus away from the positive node of amplifier AMP—providing negative differential current feedback. The resistive divider with the two resistor R effectively fixes the collector potential of the transistors Tr2 and Tr4 at 0.5 * Vdrive+0.7, thereby allowing sufficient dynamic range for the devices. When one of the transistors R is variable, or when a small variable series resistor is inserted, possible errors in the current mirror CR1 (i.e. the collector current in Tr1 and Tr2) can be accounted for. The only error then is between current mirror CR1 and current mirror CR2.

By using this current mirror concept, parasitic currents due to parasitic capacitances are automatically compensated for.

The video source VS supplies an output signal which is the sum of a video signal and an offset voltage. This offset voltage serves for blacklevel adjustment and for allowing for possible differences between different emitter characteristics. The offset voltage also improves the speed of the device by keeping the device capacitances charged. Typically, the offset voltage will be a relatively small voltage.

Figure 2:
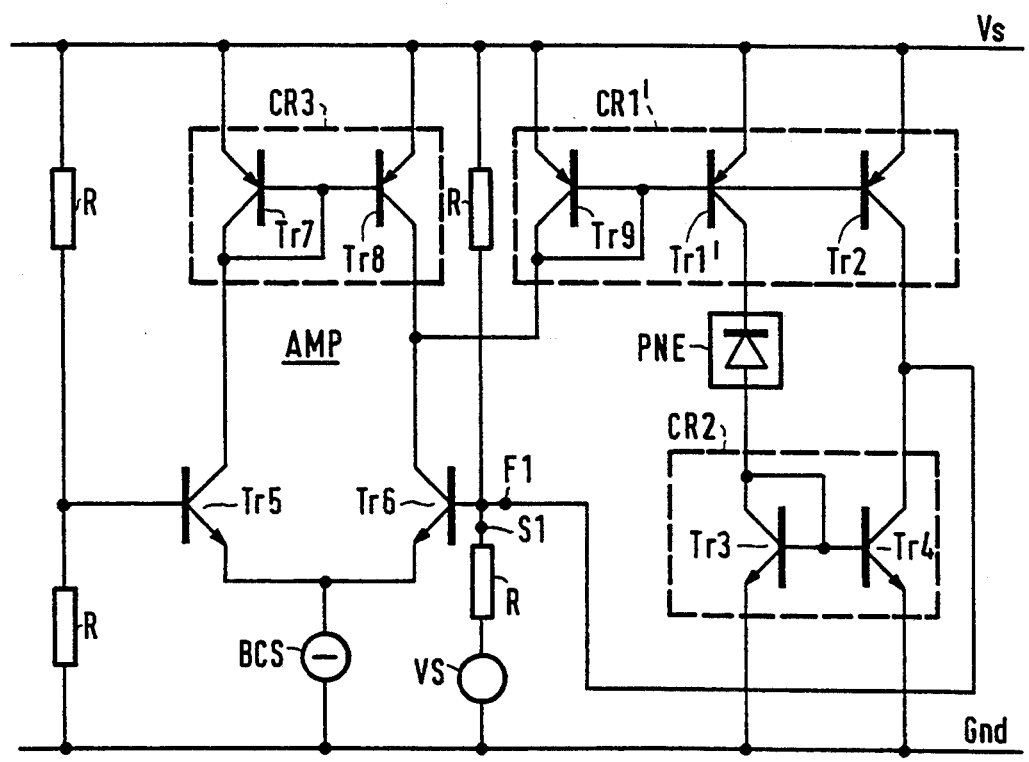
FIG. 2 shows a second embodiment of a PN emitter driver in accordance with the present invention.

FIG. 2 shows an alternative driver for the PN emitter PNE. In this circuit, use is again made of current mirrors, but instead of a voltage from the differential amplifier, a difference current is applied to the first current mirror CR1'. In FIG. 2, the differential amplifier AMP comprises two NPN transistors Tr5 and Tr6 whose interconnected emitters are connected to ground Gnd through bias current source BCS. A third current mirror CR3 comprises two PNP transistors Tr7 and Tr8. The base and the collector of the input transistor Tr7 are connected to the collector of transistor Tr5. The collector of the output transistor Tr8 of the third current mirror CR3 is connected to the collector of the transistor Tr6, and to the collector and base of an input transistor Tr9 of the first current mirror CR1'. A first output transistor Tr1' of the first current mirror CR1' is connected to the cathode of the PN emitter PNE. The emitters of the current mirror transistors Tr7, Tr8, Tr9, Tr1' and Tr2 are connected to a supply voltage Vs.

The bases of the differential amplifier transistors Tr5 and Tr6 are connected to middle connections of respective resistive dividers. Each resistive divider has two equal resistors R. The resistive divider at the base of transistor Tr5 is between the supply voltage Vs and ground Gnd. The video source VS has one terminal connected to ground Gnd and another terminal connected to the signal input SI of the differential amplifier AMP, i.e. the base of transistor Tr6, through one of the resistive divider resistors R.

It may be evident that other embodiments are possible as well. The most important aspect of the present invention is the use of differential current (i.e. emission current) feedback using current mirror.

We claim:

1. A display device having a display tube including a cold cathode, said display device comprising:

amplifying means having a signal input and a feedback input;

first current mirror means coupled to said amplifying means and having a first terminal and a second terminal;

second current mirror means having an input and an output;

said cold cathode having a first end coupled to said first terminal of said first current mirror means, and a second end coupled to said input of said second current mirror means; and feedback means having a first end coupled to said second terminal of said first current mirror means and to said output of said second current mirror means, and a second end coupled to said feedback input of said amplifying means.

2. A display device as claimed in claim 1, wherein said amplifying means have a voltage output coupled to a main terminal of said first current mirror means, while said first terminal of said first current mirror means is an input terminal, and said second terminal of said first current mirror means is an output terminal.

3. A display device as claimed in claim 1, wherein said amplifying means have a current output coupled to an input of said first current mirror means, said first and second terminals of said first current mirror means being output terminals.

* * * * *